United States Patent [19]

Welsch

[11] 4,382,517
[45] May 10, 1983

[54] PANELS FOR HOLDING PRINTED CIRCUIT BOARDS

[75] Inventor: John H. Welsch, Moscow, Pa.

[73] Assignee: Metropolitan Wire Corporation, Wilkes-Barre, Pa.

[21] Appl. No.: 236,616

[22] Filed: Feb. 20, 1981

[51] Int. Cl.³ .............................................. A47F 5/00
[52] U.S. Cl. ..................................... 211/41; 206/454; 361/415
[58] Field of Search ................. 211/41, 184; 361/415, 361/396, 412; 206/454, 455, 456, 334

[56] References Cited

U.S. PATENT DOCUMENTS

| | | | |
|---|---|---|---|
| 3,161,294 | 12/1964 | Meuche | 211/41 |
| 3,733,523 | 5/1973 | Reynolds et al. | 211/41 X |
| 3,897,871 | 8/1975 | Zinnbauer | 211/41 X |
| 4,099,623 | 7/1978 | Van Osdol | 211/41 |
| 4,234,089 | 11/1980 | Morris | 206/456 |
| 4,261,465 | 4/1981 | Thomas | 211/41 |

FOREIGN PATENT DOCUMENTS 1503781 3/1978 United Kingdom ................ 361/415

Primary Examiner—James T. McCall
Assistant Examiner—Robert W. Gibson, Jr.
Attorney, Agent, or Firm—Goodman & Teitelbaum

[57] ABSTRACT

Panels for holding printed circuit boards and the like which includes at least a pair of panels, each panel having a front surface with raised portions thereon to provide a criss-cross arrangement of recesses for receiving edges of the printed circuit boards therein, the recesses extending at inclined angles to the side edges of the panel to hold the printed circuit boards in an inclined position between the two panels. The raised portions are preferably diamond-shaped. Partition members divide each of the panels into two sections so that the printed circuit boards can be received from each side edge of the panels. Cutouts are provided in each side edge of the panel for adjustably mounting the panels on parallel rods of the cart, wherein the panels are slidable along these rods to a selected position and then secured in the selected position by fastening members. Preferably, each of the panels includes a plate member secured to a frame member, the raised portions and recesses being provided on the plate member and the cutouts being provided in the frame member.

9 Claims, 7 Drawing Figures

U.S. Patent May 10, 1983 Sheet 1 of 2 4,382,517
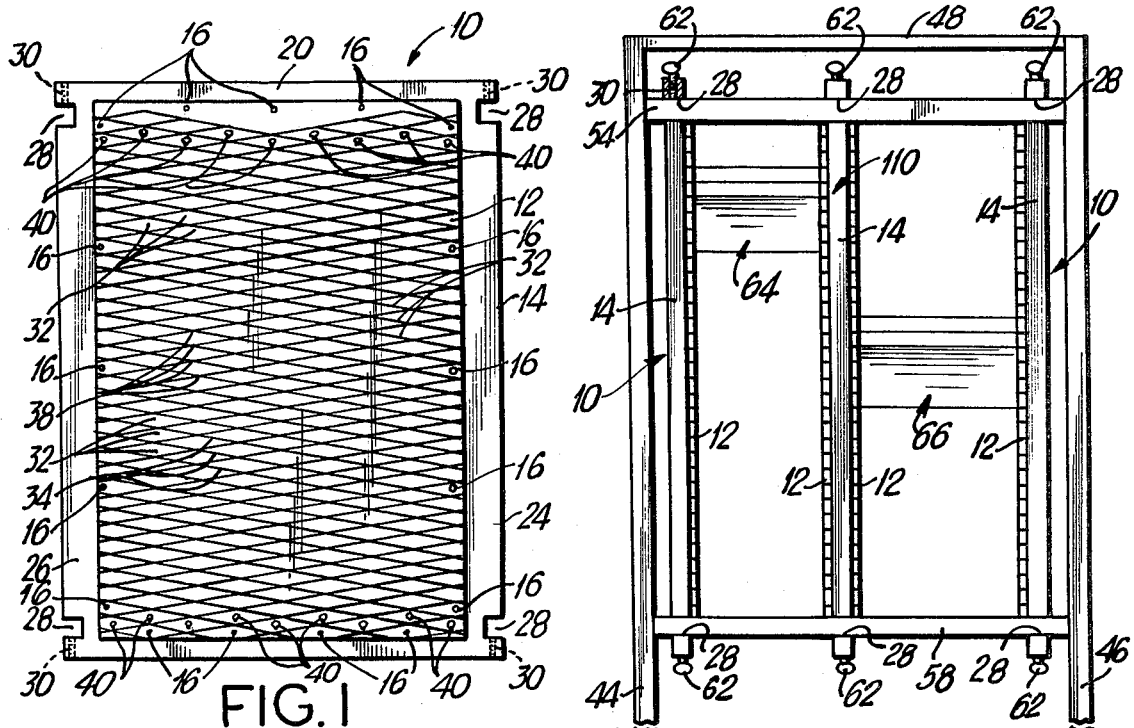
FIG.1
FIG.2
FIG.3
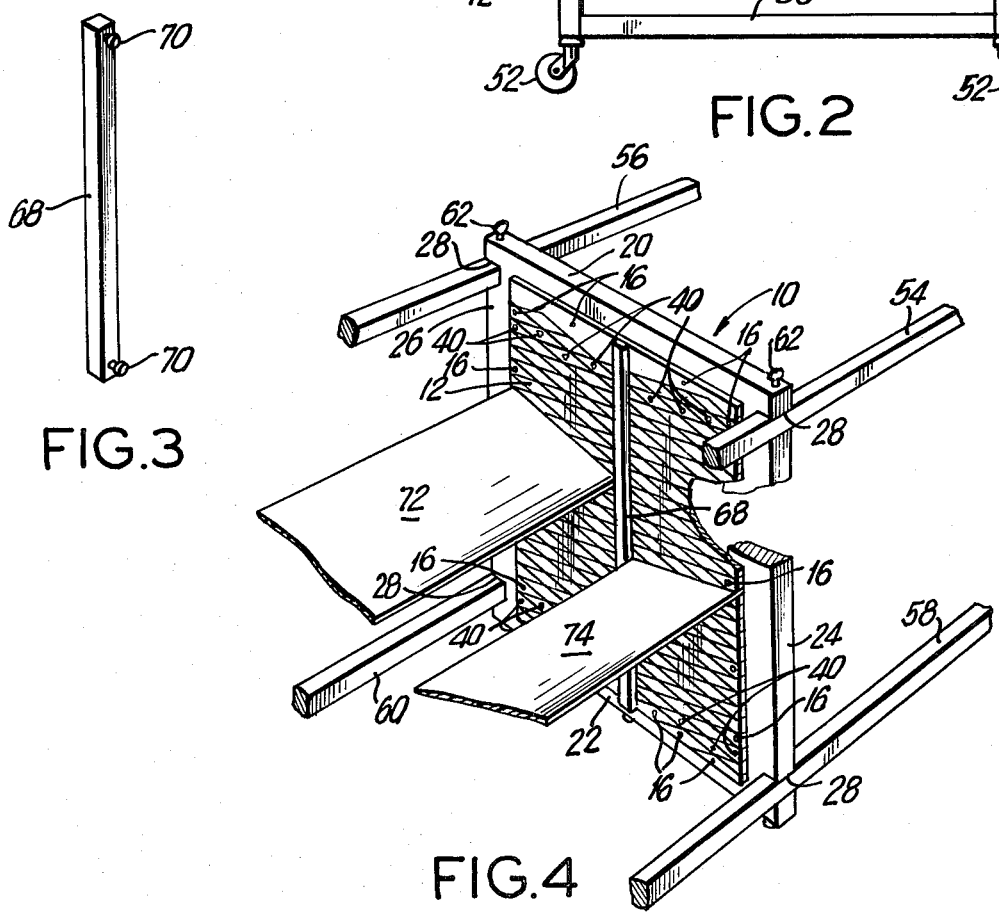
FIG.4

PANELS FOR HOLDING PRINTED CIRCUIT BOARDS

BACKGROUND OF THE INVENTION

This invention relates to panels for printed circuit boards, and more particularly to panels which can be mounted in a cart and the like for holding and transporting the printed circuit boards at an inclined position between a pair of the panels, the panels being adjustable to accommodate circuit boards of differing lengths and widths.

Printed circuit boards are well known in the art, being used extensively in all types of electrical equipment. Printed circuit boards are quite delicate and must be handled carefully during the fabrication thereof and in actual use, where damage to the circuit boards often occurs during the transportation between the assembly stations and between the work stations when in use. The circuit boards must be securely held when being transported to prevent them from shifting or inadvertently sliding out from the transporter.

Furthermore, the circuit boards come in a wide variety of sizes, having different lengths, widths and heights. At the present time, there are numerous types of transporters available for printed circuit boards, which are not specifically designed for storing and transferring these circuit boards. Some of these are in the form of baskets, some are cabinets, carts, trucks or similar types of containers. Many of these are inflexible and cannot be adjusted to accommodate the different sized printed circuit boards. Still other types of transporters have complex designs which add weight to the transporter and often present problems in manipulating the transporter.

A circuit board storage cart which attempts to solve the above problems is disclosed in U.S. Pat. No. 4,099,623. The patented cart has end frame members and cross frame members, with the end frame members having swivel casters for mobility. A pair of opposed channel assemblies, each having a plurality of corresponding left and right-hand L-shaped channels, are paired so that each pair of channels may support a circuit board. The plurality of channels of each channel assembly are vertically connected by two outer posts adjacent and interconnecting the outward ends of the channels and a middle post interconnecting the inner ends of each channel. Each channel has two sloping portions with each portion sloping downwardly from the outer ends to an apex at the inner ends to define a V-shaped channel in order to prevent the delicate circuit boards from inadvertently sliding out. The channel assemblies are attached at any one of various positions horizontally along the cross frame members so that the distance between channel assemblies may be changed to accommodate circuit boards of different sizes. Additional pairs of channels may be provided by interposing a double channel assembly between the original pair of opposed channel assemblies.

SUMMARY OF THE INVENTION

It is accordingly an object of the present invention to provide panels for holding printed circuit boards which avoid the problems of the prior art devices.

A further object of the present invention is to provide panels for printed circuit boards which can be adjustably mounted in carts and the like to accommodate varying sizes of lengths and widths of the printed circuit boards.

Another object of the present invention is to provide panels for printed circuit boards which are lightweight, durable, adjustable, simple to manufacture and easy to utilize.

And yet another object of the present invention is to provide panels for printed circuit boards which have recesses extending at an inclined angle to side edges of the panels to hold the printed circuit boards in an inclined position between the two panels to prevent the circuit boards from inadvertently sliding out.

A still further object of the present invention is to provide panels for printed circuit boards which have sets of recesses therein to define a crisscross arrangement having V-shaped intersections so that the printed circuit boards can be received from either side edge of each panel.

And yet a further object of the present invention is to provide panels for printed circuit boards as described above which includes removable partition members to divide each panel into two sections for receiving the printed circuit boards from each of the panel side edges.

Briefly, in accordance with the present invention, there is provided panels for holding printed circuit boards in a cart and the like which includes at least a pair of panels, each panel having side edges and a front surface disposed between the side edges, the front surface having raised portions to provide recesses for receiving edges of the printed circuit boards therein, the recesses extending at an inclined angle to the side edges of the panel to hold the printed circuit boards in an inclined position between the two panels.

The raised portions are preferably diamond-shaped, being disposed in columns across the panel front surface with ends of the diamond-shaped portions in one column being disposed between the ends of the diamond-shaped portions in an adjacent column in an alternating manner to define a crisscross arrangement of the recesses. Removable partition members divide each of the panels into two sections so that the printed circuit boards can be received from each side edge of the panels.

Each of the panel side edges includes cutout means therein for adjustably mounting the panels on parallel rods of the cart, and means are provided for securing the panels in a selected position on the cart rods. Preferably, each of the panels includes a plate member secured to a frame member, whereby the front surface is provided on the plate member and the cutout means are provided in the frame member. A third panel may be disposed between the pair of panels in the cart for holding additional circuit boards, the third panel including a frame member and a plate member positioned on opposite faces thereof.

BRIEF DESCRIPTION OF THE DRAWINGS

With the above and additional objects and advantages in view, as will hereinafter appear, this invention comprises the devices, combinations and arrangements of parts hereinafter described by way of example and illustrated in the accompanying drawings of a preferred embodiment in which:

FIG. 1 is a front view showing a panel according to the present invention;

FIG. 2 is a side view showing the panels mounted in a cart;

FIG. 3 is a perspective view of a partition member according to the present invention, showing the bottom projections thereon;

FIG. 4 is a fragmented perspective view showing a panel mounted on the rods of the cart, the panel holding printed circuit boards thereon;

In the various figures of the drawing, like reference characters designate like parts.

DETAILED DESCRIPTION OF THE PREFERRED EMBODIMENT

Figure 5:
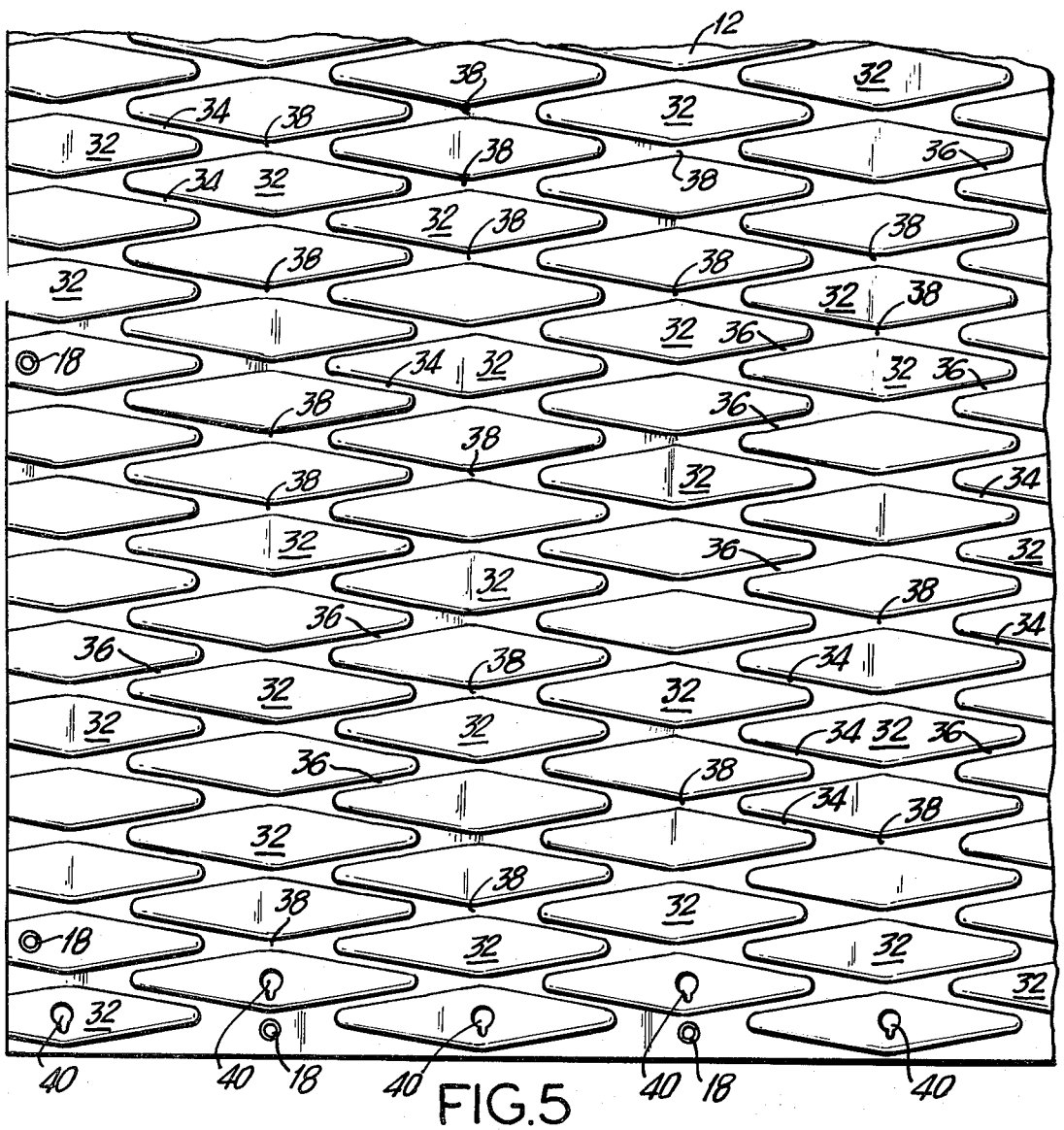
FIG. 5 is an enlarged fragmented front view of the plate of the panel showing the details thereof.

Referring now to the drawings, FIG. 1 shows a panel 10 pursuant to the present invention. The panel 10 includes a plate 12 secured onto a rectangular frame 14 by fastening means, such as screws 16. The screws 16 pass through countersunk holes 18 in the plate 12, shown in FIG. 5, and are threaded into the frame 14 so that the heads of the screws 16 are received in the countersunk portions of the holes 18.

The frame 14 is preferably metal and includes an upper member 20, a lower member 22 and side members 24, 26 which join the upper and lower members together to define a metal border for the plate 12. As shown in FIG. 4, the frame members are solid, however it would be obvious according to the present invention to make the frame members hollow to reduce the weight of the frame. If desired, the frame could be formed as one solid or hollow member rather than joining the frame members together as a unit. Each of the side members 24, 26 of the frame 14 has an upper and lower rectangular cutout 28, and a threaded opening 30 extending from the cutout 28 to the respective adjacent outer surface of the upper and lower members 20, 22, the function of which will be set forth below.

Figure 6:
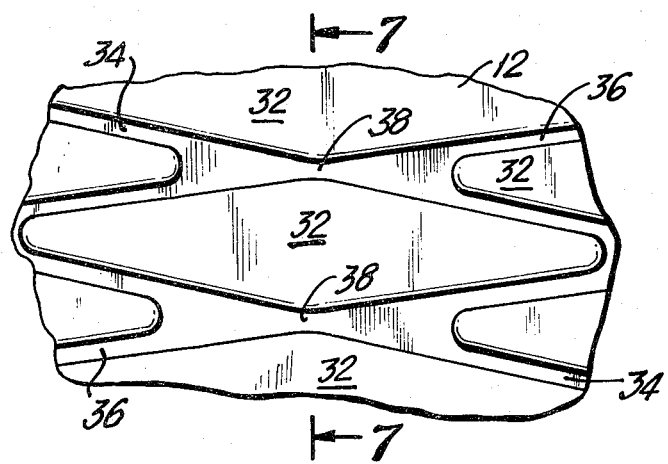
FIG. 6 is a still larger fragmented front view of a portion of the plate shown in FIG. 5.
Figure 7:
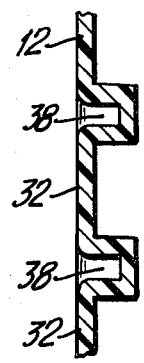
FIG. 7 is a sectional view taken substantially along line 7—7 of FIG. 6.

The plate 12 includes raised diamond-shaped portions 32 to provide two sets of recesses 34 and 36 therein as best shown in FIGS. 5, 6 and 7. The diamond-shaped portions 32 are disposed in columns across the front surface of the plate 12 with the ends of the diamond-shaped portions in one column being disposed between the ends of the diamond-shaped portions in an adjacent column in an alternating arrangement so that the diamond-shaped portions in every other column are in alignment with each other, respectively. Accordingly, the first set of recesses 34 extend downwardly at a preselected inclined angle with respect to the frame side member 26, and the second set of recesses 36 extend downwardly at the same preselected inclined angle with respect to the opposing frame side member 24 to define a crisscross arrangement. The first and second sets of recesses 34, 36 intersect each other to provide spaced apart columns of V-shaped intersections 38, wherein these V-shaped intersections 38 occur in each column of the diamond-shaped portions, being disposed between the lowermost and uppermost portions of the vertically adjacent diamond-shaped portions in each column.

Furthermore, a spaced apart pair of keyhole shaped apertures 40 are provided in two of the diamond-shaped portions in each column to provide an upper and lower row of staggered keyhole shaped apertures 40, wherein the spacing between each pair of apertures 40 is the same for each column. If desired, additional intermediate staggered rows of keyhole shaped apertures could be provided in the diamond-shaped portions across the plate 12 between the upper and lower rows of keyhole shaped apertures 40, wherein the spacing between the keyhole shaped apertures would be the same in each of the columns of the diamond-shaped portions, as will be seen below in the description of the function of the keyhole shaped apertures.

Referring to FIG. 2, a cart 42 is shown having side members 44, 46 and upper and lower support members 48, 50 interconnecting the side members 44, 46. Conventional swivel casters 52 are connected to the bottoms of the side members 44, 46 to provide mobility to the cart 42. An upper pair and a lower pair of parallely spaced apart rods 54, 56 and 58, 60, as best shown in FIG. 4, are horizontally supported in a conventional manner between the side members 44, 46 of the cart 42. Preferably, the rods have a rectangular configuration in cross section, and may be either solid or hollow. Accordingly, the spacing between the upper pair of rods 54, 56 and also between the lower pair of rods 58, 60 is equal to the horizontal distance between the cutouts 28 on the opposite sides of the frame 14. The vertical spacing between the pairs of rods 54, 56 and 58, 60 is equal to the vertical spacing between the cutouts 28 on each side of the frame 14.

Thus, the panels 10 are easily mounted in the cart 42, so that the rods 54, 56 and 58, 60 are disposed in their respective cutouts 28. Accordingly, the horizontal spacing between the panels 10 can be adjusted by sliding the panels 10 along the rods 54, 56 and 58, 60 to any selected position. Once positioned, the panels 10 can be secured in the selected position by threading the threaded stud of a conventional thumbscrew 62 into the threaded openings 30 in the frame 14 so that the thumbscrew 62 engages against the rods 54, 56 and 58, 60.

It is noted, that when it is desired to store more than two sets of circuit boards in one cart, where one set 64 of circuit boards may have a different length or width than the other set 66 of circuit boards, as shown in FIG. 2, a modified panel 110 may be used as the intermediate panel. The panel 110 is similar to the above mentioned panels 10, except the panel 110 has a plate 12 secured to each face of the frame 14 in the same manner mentioned above. Thus, the panel 110 can be used in place of two intermediate panels 10.

A partition member 68 is shown in FIG. 3. The partition member 68 has an elongated body and is preferably rectangularly shaped in cross section. A pair of spaced apart projections 70 having enlarged heads thereon at the free ends thereof are provided at the opposite ends of the bottom portion of the partition member 68. The spacing between the projections 70 corresponds to the spacing between the upper and lower keyhole shaped apertures 40 in each column of the diamond-shaped portions of the plate 12 so that the projections 70 can be received and retained in a selected one of the pairs of upper and lower apertures 40. Accordingly, the enlarged head of each projection 70 is sized to pass through the enlarged circular opening of each keyhole shaped aperture 40. Once inserted, the partition member 68 is pushed downwardly so that the neck of the projections 70 are disposed in the narrow slit portion of each keyhole shaped aperture 40, the enlarged head of the projections 70 being too large to be pulled out through these narrow slit portions, and thereby the partition member 68 is secured to the plate 12 as shown in FIG. 4.

If desired, the partition member can have more than two projections thereon as long as a like number of properly spaced apart keyhole shaped apertures are provided in the plate. Furthermore, the partition member could be made shorter as long as there are at least two projections thereon and corresponding keyhole shaped apertures in the plate. Thus, more than one of the shorter partition members may be positioned on the plate in a horizontally spaced apart relationship with each other.

The partition members 68 divide each panel 10, 110 into two sections for receiving printed circuit boards 72, 74 from each side edge of the panel as shown in FIG. 4. Though the circuit boards 72, 74 have the same length for mounting between two panels 10, they have different widths. Thus, the partition member 68 permits two sets of circuit boards having the same lengths but different widths to be mounted between only two panel members 10, 110. The circuit boards 72, 74 are inserted into the recesses 34, 36, respectively, and slide downwardly in these recesses until their edges abut against opposite sides of the partition member 68, at which point the circuit boards will be held at rest. Preferably, as shown by the position of the keyhole shaped apertures 40 in FIG. 5, the partition member 68 will be in alignment with a selected one of the columns of V-shaped intersections 38 when secured to the plate 12.

If the above mentioned shorter partition members are used, then in addition to being divided into right and left sections, the panel will be further divided into upper and lower parts for each of the two sections.

Preferably, the plate 12 is fabricated from a plastic material, though a suitable metal material may also be used.

It is noted, that it is possible to use round holes in lieu of the above-mentioned keyhole shaped apertures 40 for securing the partition member 68 to the plate 12. Accordingly, when the projections 70 are inserted through the round holes and the partition member 68 is pushed downwardly, the axes of the projections 70 become misaligned with the axes of the round holes, and the enlarged heads of the projections 70 become engaged behind the surfaces adjacent the lower portions of the round holes, thus preventing the removal of the projections 70 from the round holes, and thereby securing the partition member 68 to the plate 12.

Furthermore, though the cutouts 28 are formed in a one piece frame 14, it is understood according to the present invention, that the frame could be modified to include additional parts in order to provide suitable cutouts or rod-receiving apertures as required for slidably mounting the frame on the rods 54, 56 and 58, 60 of the cart 42 in any selected position.

Numerous alterations of the structure herein disclosed will suggest themselves to those skilled in the art. However, it is to be understood that the present disclosure relates to a preferred embodiment of the invention which is for purposes of illustration only and is not to be construed as a limitation of the invention.

What is claimed is:

1. Panels for holding printed circuit boards in a cart and the like, comprising:
    at least a pair of panels;
    each panel including side edges and a front surface disposed between said side edges;
    said front surfaces having raised portions to provide recess means for receiving edges of the printed circuit boards therein;
    said recess means extending at an inclined angle to said side edges of said panel to hold the printed circuit boards in an inclined position between said two panels; and
    said recess means including first and second sets of recesses, said first set extending at a specific inclined angle with respect to one panel side edge and said second set extending at said specific inclined angle with respect to the opposite panel side edge to define a crisscross arrangement with said first and second sets of recesses intersecting each other to provide spaced apart columns of V-shaped intersections.

2. Panels as in claim 1, including a partition member for each panel to divide each panel into two sections for receiving printed circuit boards from each panel side edge, and securing means for removably securing said partition member to said front surface of an associated panel with said partition member being in alignment with a selected one of said columns of V-shaped intersections.

3. Panels as in claim 2, wherein said securing means includes a spaced apart pair of projections on a bottom portion of said partition member, said projections having an enlarged head, and first and second series of keyhole shaped apertures provided in said raised portions of said panel front surface to provide pairs of said keyhole shaped apertures across said front surface between said panel side edges, said pair of projections being received and retained in a selected one of said pairs of apertures, said enlarged head of each projection being sized to pass through the enlarged circular opening of each aperture and being too large to be pulled out through the narrow slit portion of each aperture.

4. Panels as in claim 1, wherein said raised portions are diamond-shaped, said diamond-shaped portions being disposed in columns across said panel front surface with first ends of said diamond-shaped portions in one column being disposed between second ends of said diamond-shaped portions in an adjacent column in an alternating arrangement to define said first and second set of recesses.

5. Panels as in claim 4, including a partition member for each panel to divide each panel into two sections for receiving printed circuit boards from each panel side edge, and securing means for removably securing said partition member to said front surface of an associated panel.

6. Panels as in claim 5, wherein said securing means includes a spaced apart pair of projections on a bottom portion of said partition member, said projections having an enlarged head, and a first and second series of keyhole shaped apertures provided in said diamond-shaped portions of said panel front surface to provide pairs of said keyhole shaped apertures across said front surface between said panel side edges, said pair of projections being received and retained in a selected one of said pairs of apertures.

7. Panels as in claim 1, wherein each of said panel side edges includes cut-out means therein for mounting said panels on parallel rods of the cart, and means for securing said panels in a selected position on the cart rods.

8. Panels for holding printed circuit boards in a cart and the like, comprising:
    at least a pair of panels;

each panel including side edges and a front surface disposed between said side edges;

said front surface having raised portions to provide recess means for receiving edges of the printed circuit boards therein;

said recess means extending at an inclined angle to said side edges of said panel to hold the printed circuit boards in an inclined position between said two panels;

each of said panel side edges including cut-out means therein for mounting said panels on parallel rods of the cart, and means for securing said panels in a selected position on the cart rods; and each of said panels including a plate member, a frame member and means for securing said plate member to said frame member, said panel front surface being provided on said plate member, and said cut-out means being provided in said frame member.

9. Panels as in claim 8, including a third panel disposed between said pair of panels in the cart, said third panel including a frame member and a plate member positioned on opposite faces of said third panel frame member, and means for securing said third panel plate members to said third panel frame member, said panel front surface being provided on each of said third panel plate members, said cut-out means being provided in said third panel frame member.

* * * * *